United States Patent [19]
Kirihata et al.

[11] Patent Number: 5,917,744
[45] Date of Patent: Jun. 29, 1999

[54] SEMICONDUCTOR MEMORY HAVING HIERARCHICAL BIT LINE ARCHITECTURE WITH INTERLEAVED MASTER BITLINES

[75] Inventors: Toshiaki Kirihata; Gerhard Mueller, both of Wappingers Falls, N.Y.

[73] Assignees: Siemens Aktiengesellschaft, Munich, Germany; International Business Machines Corporation, Armonk, N.Y.

[21] Appl. No.: 08/993,537

[22] Filed: Dec. 18, 1997

[51] Int. Cl.[6] .................................................. G11C 5/06
[52] U.S. Cl. .............................. 365/63; 365/51; 365/205; 365/207
[58] Field of Search ............................... 365/63, 51, 149, 365/202, 205, 207

[56] References Cited

U.S. PATENT DOCUMENTS

| | | | |
|---|---|---|---|
| Re. 33,694 | 9/1991 | McElroy | 365/149 |
| 4,922,460 | 5/1990 | Furutani et al. | 365/207 |
| 5,214,601 | 5/1993 | Hidaka et al. | 365/63 |
| 5,396,450 | 3/1995 | Takashima et al. | 365/51 |
| 5,499,205 | 3/1996 | Ahn et al. | 365/63 |
| 5,550,769 | 8/1996 | Hidaka et al. | 365/63 |
| 5,555,203 | 9/1996 | Shiratake et al. | 365/51 |
| 5,555,519 | 9/1996 | Takashima et al. | 365/63 |
| 5,602,772 | 2/1997 | Nakano et al. | 365/51 |
| 5,610,871 | 3/1997 | Hidaka | 365/230.03 |
| 5,715,189 | 2/1998 | Asakura | 365/72 |
| 5,732,010 | 3/1998 | Takashima et al. | 365/63 |
| 5,757,692 | 5/1998 | Suh | 365/149 |
| 5,761,109 | 6/1998 | Takashima et al. | 365/63 |
| 5,825,683 | 10/1998 | Chang | 365/104 |

*Primary Examiner*—David Nelms
*Assistant Examiner*—Hien Nguyen
*Attorney, Agent, or Firm*—Stanton C. Braden

[57] ABSTRACT

Disclosed is a semiconductor memory employing a hierarchical bitline architecture which allows for a widened master bitline pitch as well as low bitline capacitance. In an exemplary embodiment, the memory (30) includes a plurality of memory cells (MC) arranged in rows and columns for storing data. Each column has at least one sense amplifier ($SA_i$), at least one pair of master bitlines ($MBL_i$, $\overline{MBL}_i$) operatively coupled to the sense amplifier, and at least two pairs of local bitlines ($LBL_{1i}$, $\overline{LBL}_{1i}$, $LBL_{2i}$, $\overline{LBL}_{2i}$), coupled to memory cells and selectively coupled to the sense amplifier. At least one of the local bitline pairs is selectively coupled to the sense amplifier via the master bitline pair. Each master bitline pair has a length shorter than a column length, and the master bitlines are arranged in an interleaved configuration. The pitch of at least a portion of at least some of the master bitlines is greater than the local bitline pitch. The master bitlines may be arranged in either folded or open configurations. The master bitline pitch may be about twice the local bitline pitch.

28 Claims, 11 Drawing Sheets

SEMICONDUCTOR MEMORY HAVING HIERARCHICAL BIT LINE ARCHITECTURE WITH INTERLEAVED MASTER BITLINES

FIELD OF THE INVENTION

The present invention relates to semiconductor memories such as dynamic random access memories (DRAMs). More specifically, the invention relates to a semiconductor memory having an improved hierarchical bitline architecture with interleaved master bitlines.

BACKGROUND OF THE INVENTION

As the integration density of contemporary semiconductor memories continues to improve, there is a need for designs conducive to high yields, which are not overly complex and which do not compromise performance objectives. One critical memory parameter in high density designs is the bitline capacitance. As memories become smaller, the architectures should be designed with a reduced number of sense amplifier banks while preventing bitline capacitance and interbitline capacitance from becoming prohibitively large. The larger the bitline capacitance is relative to the storage cell capacitance, the lower is the storage cell signal at the input to the associated sense amplifier, and the higher the likelihood of data errors.

FIG. 1 illustrates a prior art DRAM architecture referred to as a full-length bitline architecture. Each sense amplifier (SA) is connected to one or two pairs of relatively long bitlines typically composed of tungsten. Each bitline connects to a large number of memory cells MC distributed along that bitline. For instance, sense amplifier $SA_{i+1}$ in column (i+1) connects to true bitline $BL_{(i+1)a}$ and its complement $\overline{BL_{(i+1)a}}$ on one side, and to true bitline $BL_{i+1)b}$ and complementary bitline $\overline{BL_{(i+1)b}}$ on the other side. This is referred to as a "folded bitline architecture". As used herein, a column sometimes refers to a bitline pair. In some cases, a column refers to two adjacent bitlines. Isolation switches (not shown) on both sides of each sense amplifier are controlled to select which bitline group is to be written to or read from. Wordlines as $WL_j$, $WL_{j+1}$ running perpendicular to the bitlines connect to cells of a common row and selectively activate cells MC for data transfer and refresh operations. As shown in FIG. 2, each memory cell MC consists of a field effect transistor 12 and a storage capacitor C. As is well known, during a read operation, a wordline is activated to turn on the transistors 12 in a common row, thereby transferring charge stored on capacitor C to the bitline, or vice versa. The bitlines are precharged to a predetermined reference voltage (equalization voltage) prior to a read. As the charge is transferred between the capacitor and the associated bitline when a wordline is activated, that bitline's potential changes. If a cell coupled to a true bitline is being read from, the complementary bitline functions to provide the precharge reference voltage to the sense amplifier, and vice versa. Thus, a differential voltage is produced between the true and complementary lines when a cell is accessed. This differential voltage is amplified by the sense amplifier of the column to provide solid logic levels for data readout.

The bitline capacitance is proportional to the bitline length. As such, the bitline length is limited by the maximum bitline capacitance that can be tolerated. The maximum capacitance is generally determined by the allowable sensing margin and the power dissipation. Thus, in order to increase memory capacity by increasing the number of memory cells in an array, more sense amplifiers are needed for the array. Since sense amplifiers are relatively large, however, the chip size will correspondingly increase.

FIG. 3 schematically illustrates another prior art DRAM architecture, referred to as a hierarchical bitline architecture, which addresses some of the deficiencies of the above-described full-length bitline layout. This architecture is similar to a circuit configuration disclosed in U.S. Pat. No. Re. 33,694 entitled DYNAMIC MEMORY ARRAY WITH SEGMENTED BIT LINES. Each sense amplifier such as $SA_i$ is connected to a pair of master bitlines MBL and $\overline{MBL}$ (true and complementary, respectively). The master bitlines are composed of metal such as aluminum or tungsten. A number K of switches SW are connected between each master bitline such as MBL and K corresponding local bitlines $LBL_1$–$LBL_K$ of tungsten. Control lines $17_1$–$17_K$ control the switch states of switches SW, where each control line activates or deactivates switches of a common row. The master bitlines are constructed in a different vertical layer than the local bitlines. A number of memory cells MC, typically up to several hundred, are connected to each local bitline. When a particular memory cell MC is to be accessed, the switch SW connected to the local bitline associated with that cell, e.g., to bitline $LBL_K$, is switched on via a logic high applied to control line $17_K$. As such, only one local bit line pair LBL, $\overline{LBL}$ is connected to the master bitlines of the column and to the associated sense amplifier during read/write operations. Since each local bitline is shorter than in the full length architecture, its capacitance is less. The total bitline capacitance is then the sum of the local bitline capacitance and the master bitline capacitance. However, the master bitline capacitance per unit length is less than the local bitline capacitance per unit length since the local bitlines are directly coupled to a large number of memory cells, which significantly contribute to the local bitline capacitance, whereas the master bitlines are not directly coupled to the cells. Thus, for a given column length, the total capacitance can be significantly less than in the full length layout. Therefore, less space consuming sense amplifiers are needed for a chip with a specific number of memory cells. That is, the architecture permits each sense amplifier to be used for more cells, coupled to the local bitlines and one long master bitline, thereby reducing the number of sense amplifiers per chip. A smaller chip size is thus possible, provided that the area allocated to the switches SW and additional control circuitry does not exceed the area saved by reducing the number of sense amplifiers.

One drawback of the layout of FIG. 3 is that in each column, the master bitlines run the full length of the column such that master bitlines of adjacent columns such as $C_i$, $C_{i+1}$ run side by side. Hence, the master bitline (MBL) pitch, i.e., the periodic spacing between the centerlines of adjacent master bitlines, is essentially the same as the local bitline pitch. With high density memories, the MBL pitch is thus correspondingly small. This limits the yield of the memory as the likelihood of shorts between the closely spaced MBLs is significant. Also, the width of the MBLs must be kept narrow to provide adequate spacing between adjacent MBLs, which renders the fabrication process more difficult. Further, a close spacing between neighboring MBLs leads to higher interbitline capacitance, and thus, higher total MBL capacitance.

Another shortcoming of the architecture of FIG. 3 is the added complexity to the layout of the many bitline switches associated with each master bitline. The switches and their corresponding control lines occupy significant chip space and also render the fabrication process more difficult. Further, the attendant control and decoding circuitry needed to selectively activate and deactivate the large number of switches is complex and space consuming.

Accordingly, there is a need for a semiconductor memory architecture wherein bit line capacitance is kept low without an attendant overly complex layout, and which is conducive to a high yield.

SUMMARY

The present invention is directed towards a semiconductor memory employing a hierarchical bitline architecture which allows for a widened master bitline pitch as well as low bitline capacitance. In an exemplary embodiment, the memory includes a plurality of memory cells arranged in rows and columns for storing data. Each column has at least one sense amplifier, at least one pair of master bitlines operatively coupled to the sense amplifier, and at least two pairs of local bitlines coupled to memory cells and selectively coupled to the sense amplifier, where at least one of the local bitline pairs is selectively coupled to the sense amplifier via the master bitline pair. Each master bitline has a length shorter than a column length. The pitch of at least a portion of at least some of the master bitlines is greater than the local bitline pitch. Master bitlines are arranged in an interleaved configuration. The bitlines can be arranged in either open or folded configurations.

Advantageously, since the master bitline pitch is wider than the local bitline pitch, e.g., about twice as wide, processing of the master bitlines is easier, thereby increasing product yield. In addition, the length of each master bitline may be about the same as the length of the local bitlines, whereby the master bitline capacitance is substantially reduced. A wider master bitline pitch also decreases inter-bitline capacitance, thereby decreasing the total master bitline capacitance. Further, preferably only two bitline selection switches are used for each master bitline, such that the added circuit complexity and requisite control/decoding circuitry is not prohibitive.

In another embodiment useful for flash RAM and other applications, complementary master bitlines and local bitlines are eliminated by employing a reference cell with each sense amplifier. Interleaved master bitlines are selectively coupled to two local bitlines and are about half the column length in each memory block. Master bitline pitch is wider than local bitline pitch for this embodiment as well.

BRIEF DESCRIPTION OF THE DRAWINGS

Preferred embodiments of the present invention will now be described in reference to the drawings, in which like reference numerals depict similar or identical features throughout the drawings, wherein.

DETAILED DESCRIPTION OF THE INVENTION

The present invention relates to an improved hierarchical bitline architecture for semiconductor memories. The invention provides for a way to obtain wider master bitline pitch and lower master bitline capacitance as compared to the prior art, without undue circuit complexity. For purposes of discussion, an exemplary embodiment of the invention is described in the context of a DRAM chip. The invention however has broader applications. Merely by way of example, the invention has application in other memory devices such as EDO-DRAM, SDRAM, RAMBUS-DRAM, SLDRAM, MDRAM, SRAM, flash RAM, EPROM, EEPROM, mask ROM, or merged DRAM-logic (embedded DRAM).

Figure 4:
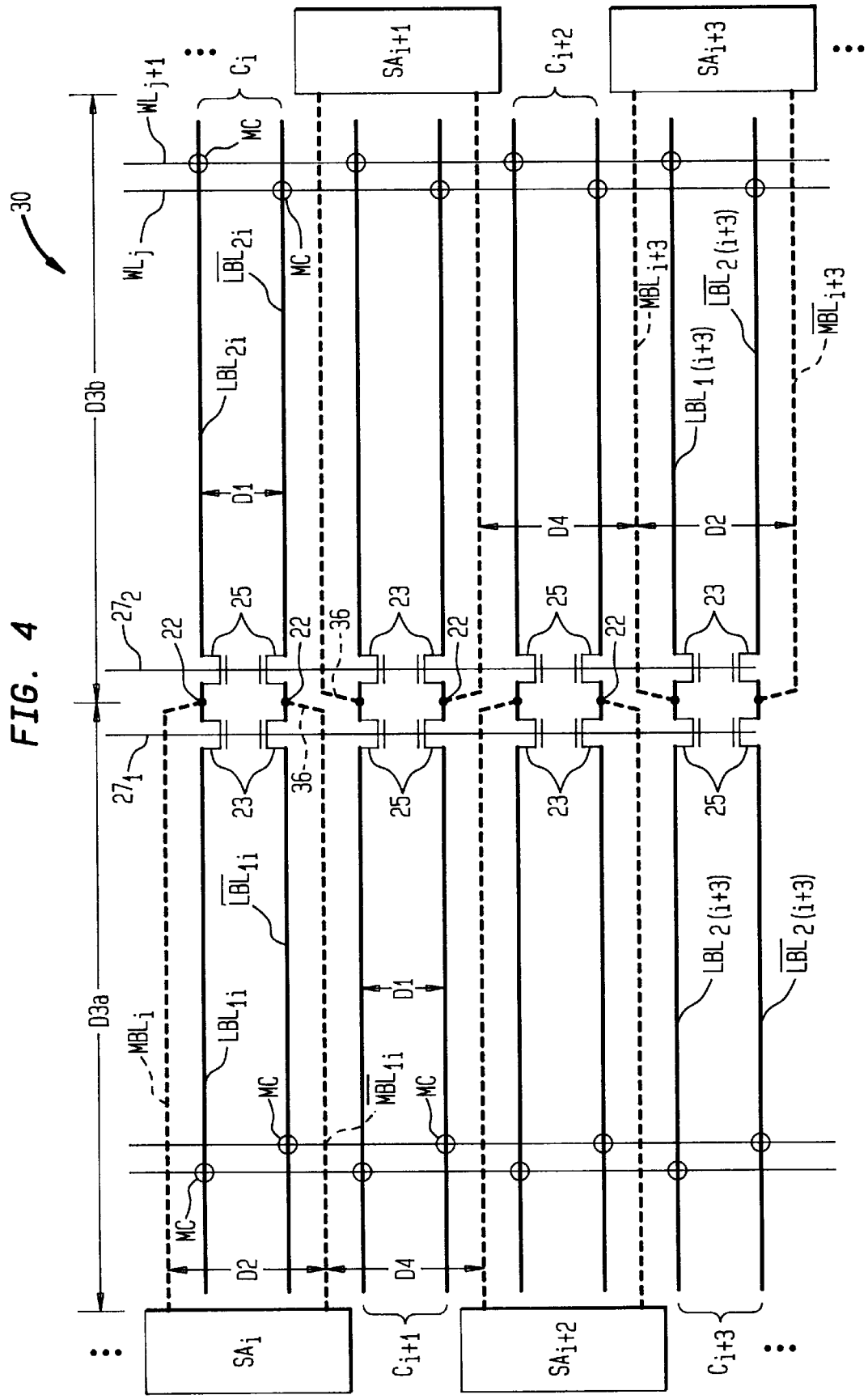
FIG. 4 shows a first embodiment of a semiconductor memory in accordance with the present invention employing a folded bitline configuration.

FIG. 4 schematically illustrates a portion of a DRAM memory cell array 30, which is a first embodiment of the present invention. Although only four columns $C_i$–$C_{i+3}$ of array 30 are shown for purposes of discussion, the array typically comprises hundreds or several thousand columns. Typically, a large number of arrays 30 are used for each DRAM chip. Each column includes a sense amplifier such as $SA_i$ which is coupled to a pair of master bitlines $MBL_{li}$, $\overline{MBL_{li}}$ in a folded bitline arrangement, i.e., in which bitline pairs are connected to the same side of the sense amplifier. The master bitline (MBL) pairs are essentially interleaved in that they alternate left to right for each sequential column. Also, the master bitlines of each column are approximately the same length as the local bitlines as LBLi, $\overline{LBLi}$. As will be discussed in further detail below, by interleaving the master bitlines in this manner, and by shortening their length to about one half the column length or less, the master bitline pitch can be widened as compared to prior art architectures. The total master bitline capacitance is reduced due to the shortened master bitline length and to the increased spacing between neighboring MBLs. The increased spacing results in a decrease in the interbitline capacitance between neighboring MBLs, thereby decreasing the total MBL capacitance. The MBL pitch may be designed as twice the LBL pitch. A wider MBL pitch leads to an improved yield for the DRAM in that the likelihood of electrical shorts occurring between adjacent master bitlines is reduced. Also, by widening the MBL pitch, the master bitline widths can be increased, thereby relaxing the fabrication requirements for the MBLs and reducing the likelihood of opens in the lines.

Each column of array 30 such as column $C_i$ includes one sense amplifier $SA_i$ which may be either be shared or unshared between columns on either side. The shared configuration is preferable in order to reduce the number of sense amplifiers for a given memory capacity. For the unshared case, which is the case shown in FIG. 4, one master bitline pair $MBL_i$, $\overline{MBLi}$ is coupled to sense amplifier SAi. Each true master bitline as $MBL_i$ is selectively connected to one of two true local bitlines $LBL_{1i}$ or $LBL_{2i}$ via one of two bitline selection switches 23 and 25, typically NFETs. Likewise, each complementary master bitline as $\overline{MBLi}$ is selectively connected to one of two complementary local bitlines $\overline{LBL_{1i}}$, or $\overline{LBL_{2i}}$, via selection switches 23 and 25 coupled thereto. The master bitlines are fabricated on a different vertical layer than the local bitlines. The MBLs may be composed of, e.g., aluminum or tungsten whereas the LBLs are typically composed of tungsten. Each local bitline connects to typically several hundred memory cells MC, e.g. 256 or 512 $8F^2$ cells where F is the minimum feature size. In the embodiment of FIG. 4, a column of memory cells (e.g., column $C_i$) is defined as the memory cells coupled to both the true local bitlines such as $LBL_{1i}$ and to the adjacent corresponding complementary bitlines as $\overline{LBL_{1i}}$. However, as used herein, the term "column" is not so limited. In other embodiments, a column of memory cells may also be considered as only those memory cells coupled to the true or complementary local bitlines, such as the memory cells coupled to $LBL_{1i}$ and $LBL_{2i}$ in the schematic layout FIG. 4. The "column length", as referred to herein, means generally the length between spaced sense amplifier banks. For example, the column length in FIG. 4 is D3a+D3b. Also, the term "interleaved" is intended to include the case of master bitlines alternating left to right in a memory cell subarray in singularly alternating columns, as shown in FIG. 4, as well as other cases where master bitlines run side by side on the left hand side of a subarray for two or more adjacent columns, and then run side by side on the right hand side of the subarray for two or more adjacent columns. In addition, the local bitline length generally means the distance separating the first memory cell coupled to one end of the local bitline to the last memory cell coupled to the other end of that local bitline (ignoring dummy cells to simplify the discussion).

In each column of array 30, one bitline selection switch 23 is coupled between the true master bitline and the local bitline closest to the sense amplifier (e.g., $LBL_{1i}$), and another switch 23 is coupled between the complementary local bitline closest to the sense amplifier (e.g. $\overline{LBL_{1i}}$) and the complementary master bitline $\overline{MBLi}$. Likewise, one switch 25 is coupled between the true local bitline furthest from the sense amplifier (e.g. $LBL_{2i}$) and the true master bitline, and another switch 25 is coupled between the complementary local bitline furthest from the sense amplifier (e.g. $\overline{LBL_{2i}}$) and the complementary master bitline. Switches 23, 25 of the same column have their sources connected at circuit node 22, which also connects to the associated MBL by means of a via hole interconnect. Each MBL may have a slight taper 36 to increase the spacing between the interleaved MBL of the adjacent column.

Switch control lines $27_1$ and $27_2$ run parallel to the word lines and connect to the gates of FET switches 23 and 25 aligned in a row. Control lines $27_1$, $27_2$ each originate from address decoder and control circuitry as known in the art. Thus, for example, when a memory cell coupled to $LBL_{1i}$ is to be accessed (written to or read from), address decoder and control circuitry (not shown) drives control line $27_1$ high to thereby turn on all FET switches 23 and 25 connected thereto. The word line for the memory cell to be accessed, e.g. $WL_j$ or $WL_{j+1}$, is activated, as is the column select line (not shown) coupled to the sense amplifier in the column of the target cell. While control line $27_1$ is high, control line $27_2$ is low, and vice versa, whereby only bitline switches 23 or 25 in any column are on at any given time. Hence, master bitline $MBL_i$ is electrically connected to either local bitline $LBL_{1i}$ or $LBL_{2i}$. Likewise, electrical connection of master bitline $\overline{MBL_1}$ is either to $\overline{LBL_{1i}}$ or $\overline{LBL_{2i}}$.

Figure 1:
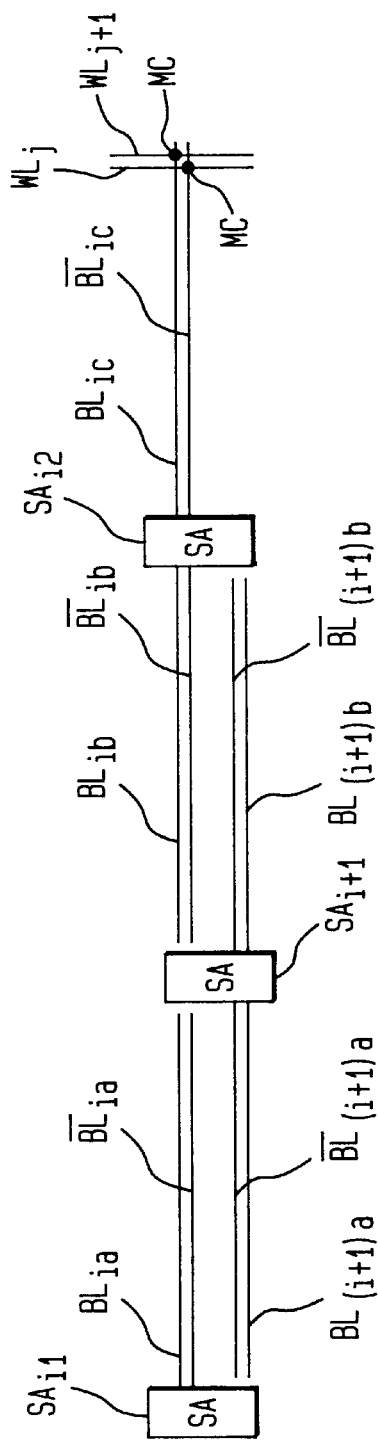
FIG. 1 illustrate a prior art full length DRAM architecture.
Figure 2:
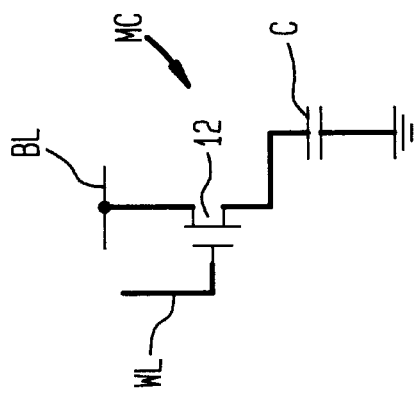
FIG. 2 is a schematic of a memory cell.
Figure 3:
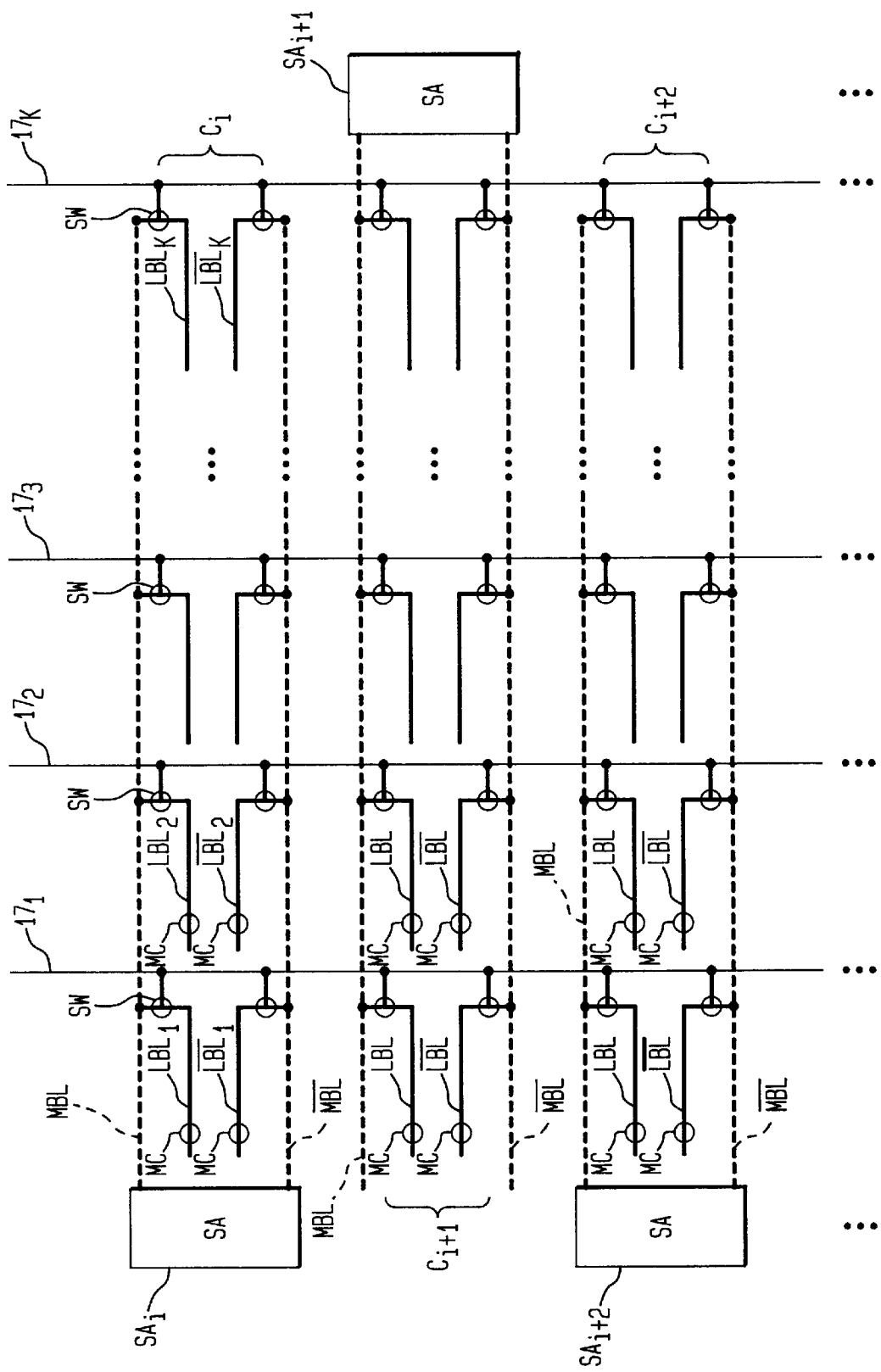
FIG. 3 illustrates a prior art DRAM with a hierarchical bitline architecture.

Preferably, the master bitlines are approximately the same length as the local bitlines. Distance D3a represents the master bitline length as well as the length of the local bitlines such as $LBL_{1i}$ on the left side of the figure. Distance D3b is the corresponding distance for bit lines on the right hand side. Distance D3a preferably equals D3b, whereby the master bitline length is about one half the column length. (One column length equals $D_{3a}+D_{3b}$, i.e., the approximate spacing between adjacent sense amplifier banks). Thus, as compared to the prior art configuration of FIG. 2 in which the master bitline is about the same length of the column, the master bitline length is halved. As such, the master bitline capacitance, which is proportional to the length, is substantially reduced. As compared to the prior art full length architecture of FIG. 1, the local bit line lengths are half as long (assuming the same distance separating the sense amplifiers in both cases). The total capacitance, which is the sum of the LBL capacitance and the MBL capacitance, is less than in the full length architecture since the MBL capacitance per unit length is less than the LBL capacitance per unit length as discussed above.

As mentioned above, since the MBL length is cut in half and the master bitlines are arranged in an interleaved configuration, master bitlines of adjacent columns do not run side by side. Consequently, the master bitline pitch, i.e., the periodic spacing between centerlines of the master bitlines, can be widened. In FIG. 4, the distance D2 represents the distance between the centerlines of true and complementary master bitlines of a common column. The distance D4 represents the distance between adjacent master bitlines two columns away. Preferably, D4 is designed about equal to D2 to provide evenly spaced master bitlines in the row direction. With evenly spaced master bitlines, the spacing between any two adjacent master bitlines is essentially maximized (for given bitline widths). The larger the spacing between master bitlines, the less the likelihood of shorts. Further, by increasing the distance between neighboring master bitline pairs, the coupling, and therefore, the noise, between master bitlines of different pairs can be reduced. Also, the master bitline capacitance is reduced due to the increased spacing.

Another advantage of the present invention architecture is that it affords flexibility in the design of the master bitline widths. By increasing the pitch, the widths may be widened to relax the fabrication requirements of producing thousands of very thin metal lines. With wider master bitlines, the likelihood of open circuits in the lines is diminished.

Figure 5:
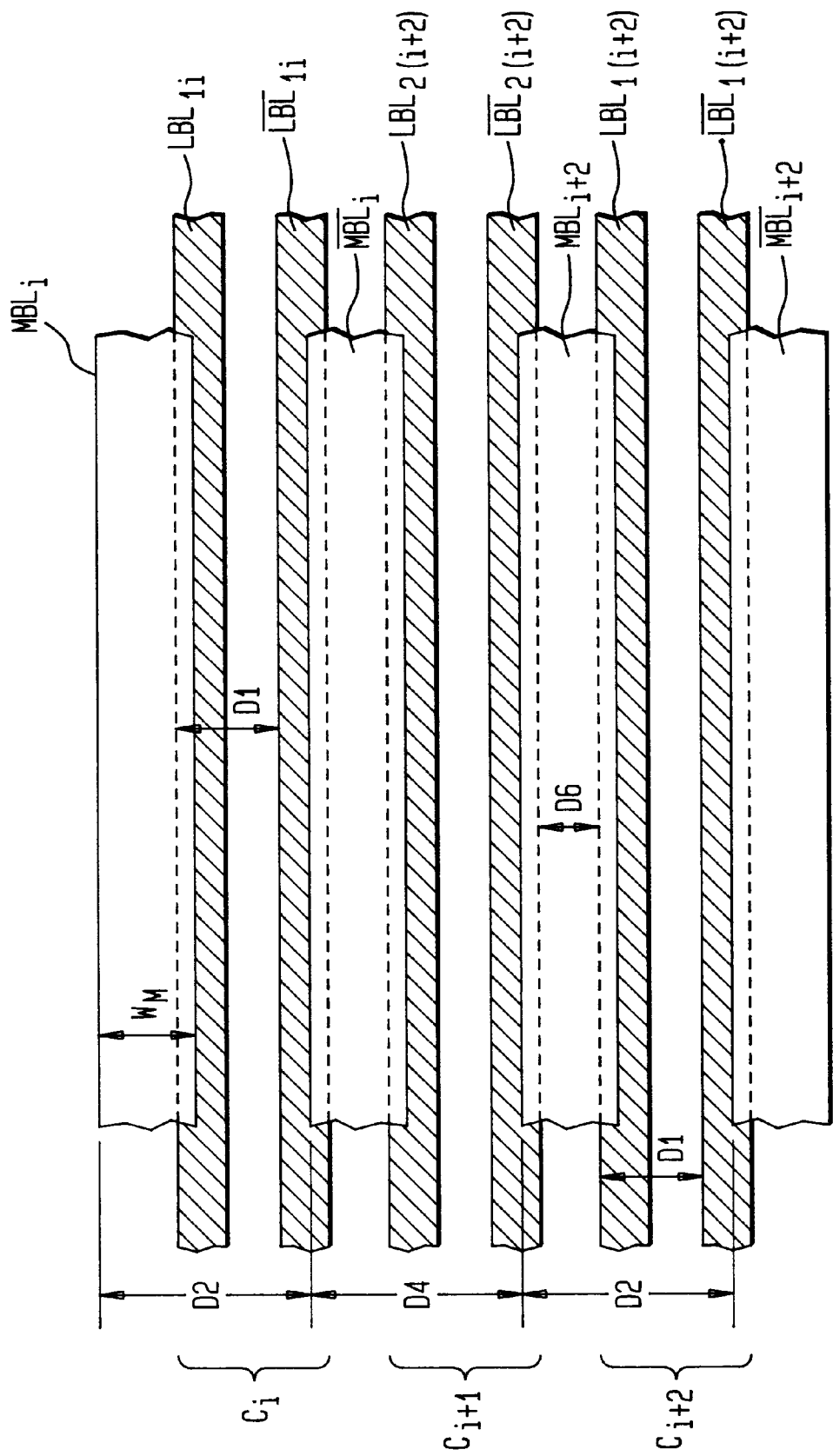
FIG. 5 illustrates a portion of a bit line layout within the memories of the present invention disclosed herein.

FIG. 5 is a plan view showing portions of exemplary master bit lines and local bit lines within memory array 30 or within other embodiments of the invention described below. As discussed above, the spacing D4 between MBLs two columns apart such as between $C_i$ and $C_{i+2}$ preferably equals the MBL pitch D2, whereby the MBLs are evenly spaced. Also, the master bitline widths $W_M$ may be designed to be about one half the MBL pitch D2. The local bitline pitch D1 is substantially less than the MBL pitch in order to facilitate connection to the memory cells of adjacent rows. For evenly spaced LBLs, i.e., where the distance D6 between LBLs of adjacent columns equals D1/2 (one half of the distance D1), the LBL pitch may be one half the MBL pitch.

For the embodiments disclosed herein, suitable timing and control circuitry for controlling the word lines, column select lines, bitline switches 23, 25, equalization circuits (not shown) coupled to the local bitlines, and so forth, are well known in the art and thus will not be described. Conventional techniques for reading and writing data into the memory cells based on incoming addresses to the DRAM may be employed in conjunction with the present invention. The circuit configuration for each sense amplifier may also be conventional.

The physical configuration of the bitline switches 23, 25 relative to the local and master bitlines may be a conventional one similar to those disclosed in U.S. Pat. No. Re. 33,694 mentioned hereinabove.

Figure 6:
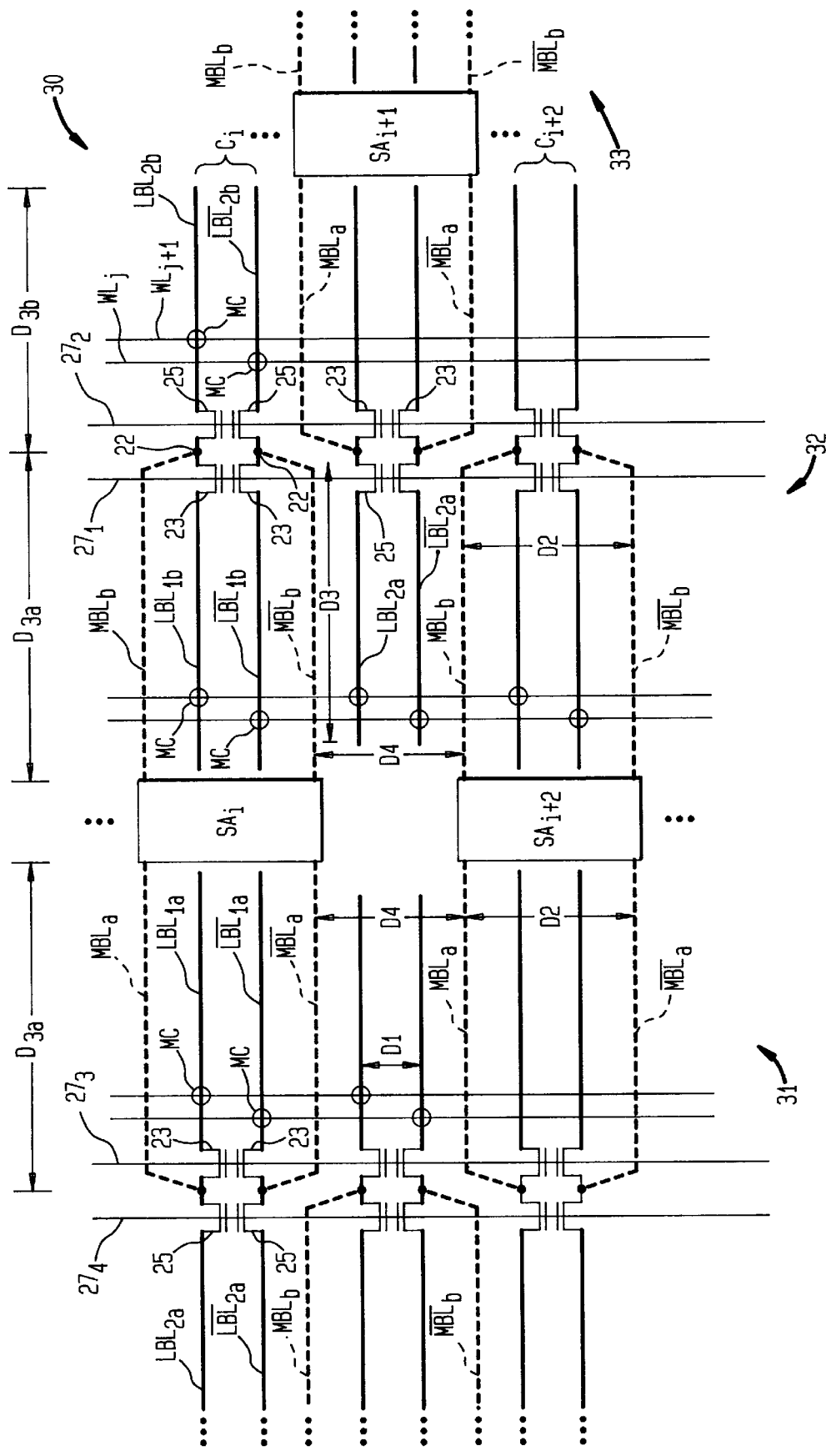
FIG. 6 illustrates an embodiment of the present invention employing shared sense amplifiers.

Referring now to FIG. 6, another embodiment 30' of the present invention is essentially the same as the memory array 30 of FIG. 4, except that a shared sense amplifier configuration is employed. Thus, each sense amplifier of FIG. 6 such as $SA_i$ includes isolation or multiplexing switches on either side (not shown) to select which subarray such as 31 or 32 to access. Each sense amplifier as SAi is thus coupled to two master bitline pairs $MBL_a$, $\overline{MBL}_a$ and $MBL_b/$, $\overline{MBL}_b$. Master bitline $MBL_b$ is selectively coupled to either local bitline $LBL_{1b}$ or $LBL_{2b}$; master bitline $MBL_a$ is selectively coupled to either local bitline $LBL_{1a}$ or $LBL_{2a}$. The complementary master bitlines $\overline{MBL}_a$ and $\overline{MBL}_b$ are likewise selectively coupled to the complementary local bitlines. To access a memory cell of subarray 32, control line $27_1$ or $27_2$ is activated; to access a cell in subarray 31, control line $27_3$ or $27_4$ is activated. Sense amplifier $SA_{i+1}$ selectively amplifies signals from memory cells of subarray 32 or from subarray 33 on the other side (only partially shown in the figure). There are typically a large number of subarrays as 31–33 in a DRAM chip, where the sense amplifiers of each subarray are coupled to column select lines from a common column decoder. In any event, the advantages described above for memory array 30 in terms of widened MBL pitch, reduced MBL capacitance, and so forth, are equally applicable to memory array 30' having the shared sense amplifier configuration. A shared sense amplifier configuration is preferred since it cuts the number of sense amplifiers in half, thereby reducing chip size for a given memory chip capacity, e.g., present day capacities such as 64Mb, 128Mb or 1Gb prototypes.

Figure 7:
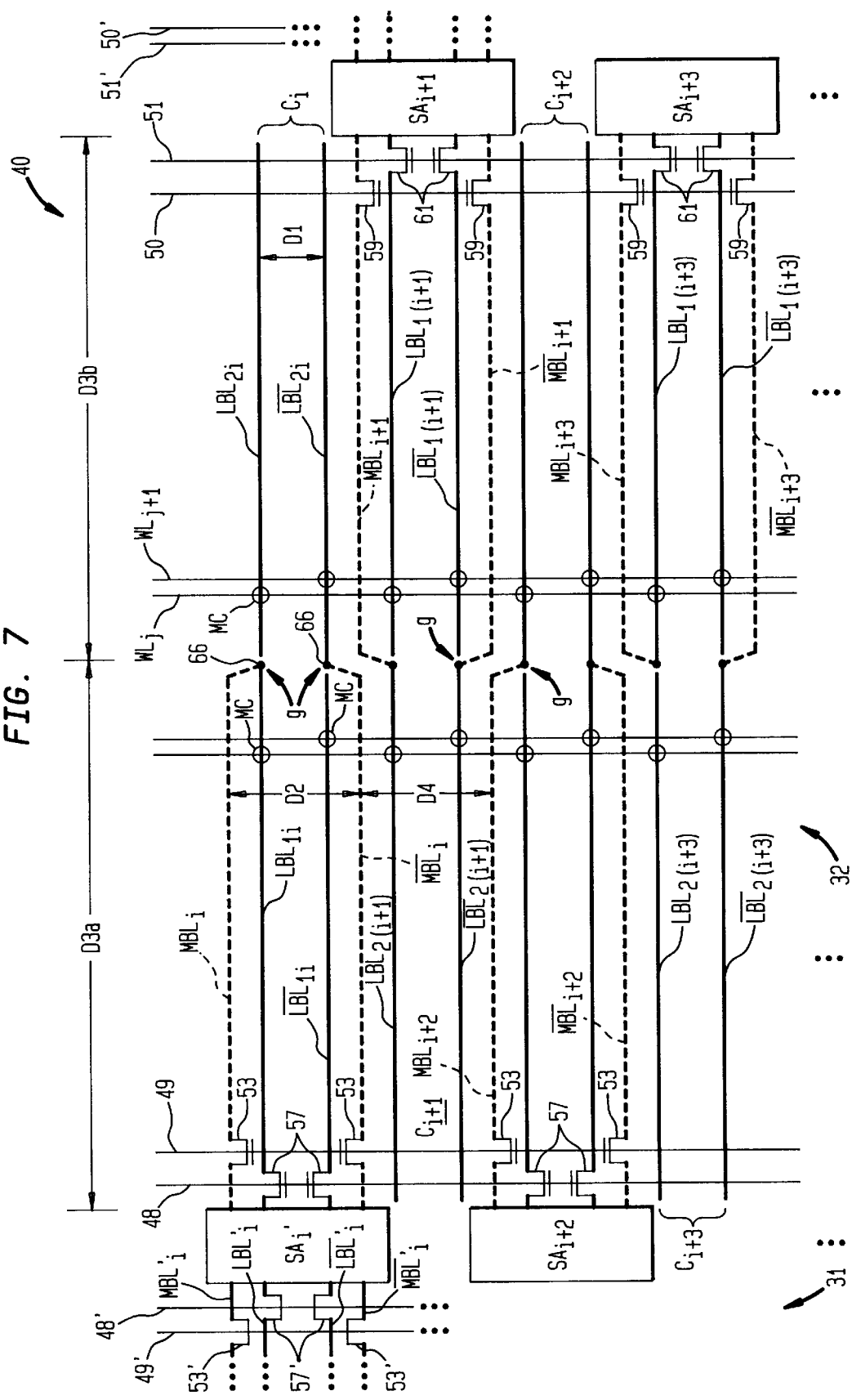
FIGS. 7 and 8 show alternative folded bitline embodiments of the present invention.

Referring to FIG. 7, an alternative embodiment of the present invention is shown, designated as memory array 40. In this embodiment, each sense amplifier as $SA_i$ is selectively connected to either master bitline pair $MBL_i$, $\overline{MBL}_i$ or to local bitline pair $LBL_{1i}$, $\overline{LBL}_{1i}$. Bitlines $MBL_i$ and $LBL_{1i}$ connect to a common circuit point (not shown) within sense amplifier $SA_i$. Likewise, bitlines $\overline{MBL}_i$ and $\overline{LBL}_{1i}$ connect to another common circuit point within $SA_i$. Thus, bitlines $MBL_i$ and $LBL_{1i}$ connect to a first sense amplifier input whereas bitlines $\overline{MBL}_i$ and $\overline{LBL}_{1i}$ connect to a second sense amplifier input. (The above-discussed differential voltage is applied between the first and second sense amplifier inputs). The sense amplifier configuration can be either shared or unshared as discussed for the embodiments above, where the shared case is most preferable. Local bitlines $LBL_{1i}$ and $LBL_{2i}$ are electrically disconnected in the central regions denoted as "g". Master bitlines $MBL_i$ and $\overline{MBL}_i$ are connected via inter-layer interconnects to local bitlines $LBL_{2i}$ and $\overline{LBL}_{2i}$, respectively, at respective circuit nodes 66. Control lines 48, 49, 50 and 51 control the on/off states of switches 57, 53, 59 and 61, respectively of all the columns.

In the "even" columns of FIG. 7, i.e., $C_i$, $C_{i+2}$, ... $C_N$, to access memory cells MC connected to the near side bitline as $LBL_{1i}$ or its complement, $\overline{LBL}_{1i}$, control line 48 is driven high to turn switches 57 on, and control line 49 is held low to turn switches 53 off. To access memory cells connected to the far side bitlines $LBL_{2i}$ or $\overline{LBL}_{2i}$, control line 49 is driven high and control line 48 is held low. Likewise, in the odd columns $C_{i+1}$, $C_{i+3}$, ... $C_{N-1}$, to access memory cells connected to the near side local bitlines as $LBL_{1(i+1)}$ or its complement, control lines 51 and 50 are driven high and low, respectively, and vice versa to access cells connected to the far side local bitlines as $LBL_{2(i+1)}$ and $\overline{LBL}_{2(i+1)}$.

If a shared sense amplifier configuration is used, each "even" sense amplifier as $SA_i$ would be selectively coupled on one side to master bitline pair $MBL_i$, $\overline{MBL}_i$ or local bitline pair $LBL_{1i}$, $\overline{LBL}_{1i}$ as described above, and on the other side to MBL pair $MBL_i'$, $\overline{MBL}_i'$ or LBL pair $LBL_{1i}'$, $LBL_{1i}'$. Control lines 48' and 49' would operate in an analogous fashion as 48, 49 to control the states of switches 53' and 57'. Isolation (multiplexing) switches may be employed within each sense amplifier in a conventional manner to select which subarray to access, e.g., subarray 31 or 32. Preferably, however, switches 53, 53', 57 and 57' have a dual function as LBL select switches and as isolation switches. This approach conserves space for the isolation switches that would otherwise be utilized. Thus, for example, to access subarray 32, control lines 48' and 49' would be held low to isolate subarray 31 from the even sense amplifiers while one of control lines 48 or 49 is driven high to access the targeted local bitline of subarray 32. Likewise, a shared subarray (not shown) on the opposite side of the odd sense amplifiers as $SA_{i+1}$ can be isolated or accessed in an analogous manner under the control of control lines 50, 51, 50' and 51'.

The above-described advantages of memory array 30, i.e., wider master bitline pitch, lower master bitline capacitance, and so on, are likewise exhibited by the embodiment 40 of FIG. 7. The distances D1, D2, D3a, D3b, D4 may be the same or similar to those in memory array 30. One difference is that memory array 40 employs four control lines 48–51 for each subarray whereas array 30 employs only two. One advantage of array 40 is that the memory cells MC coupled to the near side local bitlines as $LBL_{1i}$ do not see any master bitline capacitance, whereby the cell signals from those memory cells would be higher than for those in array 30.

Figure 8:
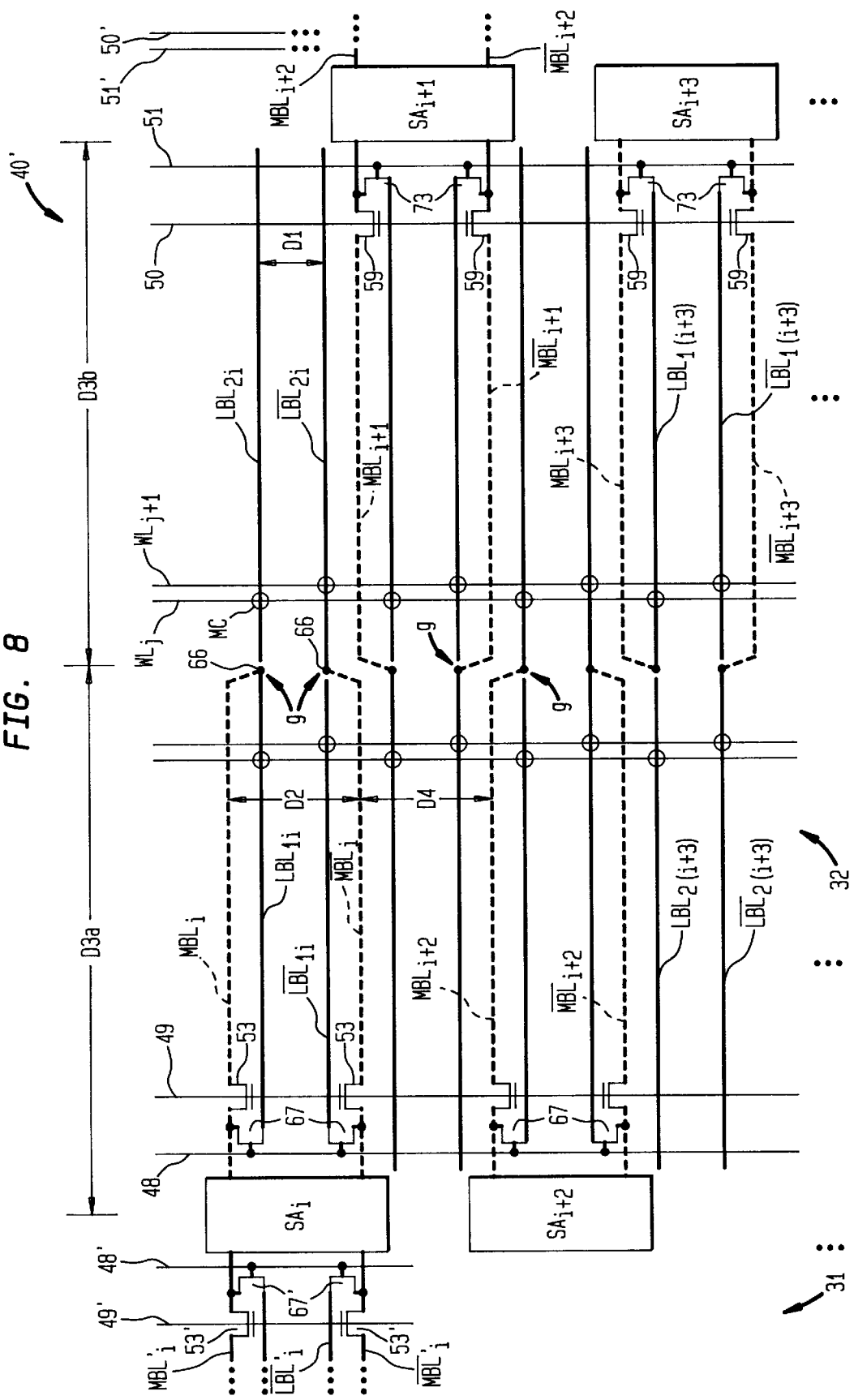

Yet another embodiment of the invention is schematically illustrated in FIG. 8. Memory array 40' is essentially the same as memory array 40 of FIG. 7 except that the near side local bitlines are not coupled directly into the sense amplifiers but are instead selectively coupled to the associated master bitlines at the sense amplifier inputs via switches 67 or 73. For instance, to access cells connected to $LBL_{1i}$ or $\overline{LBL}_{1i}$, control line 48 is driven high to turn switches 67 on and control line 49 is held low to turn off switches 53, and vice versa to access cells connected to $LBL_{2i}$ or $\overline{LBL}_{2i}$. Control lines 50 and 51 are analogously driven high or low to selectively access memory cells in the odd columns. Otherwise, array 40' affords the same advantages of memory array 40 discussed above. If a shared sense amplifier arrangement is used, the local bitline selection switches could also function as isolation switches under the control of control lines 48–51 and 48'–51' as described above.

Figure 9:
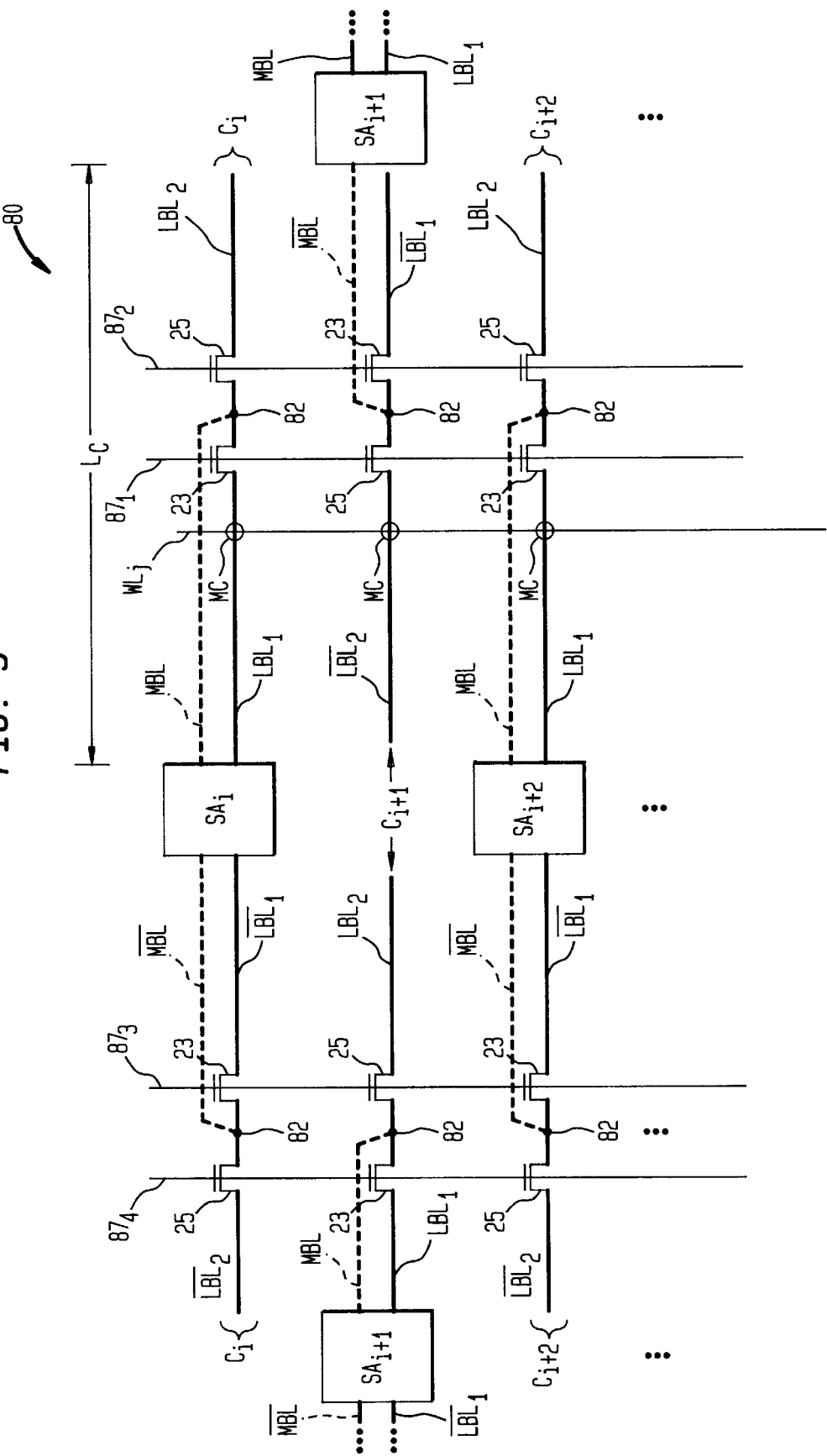
FIG. 9 illustrates an embodiment of the present invention employing an open bitline configuration.

Referring now to FIG. 9, another embodiment of the present invention is shown, designated as memory array 80. This embodiment employs an open bitline architecture with interleaved master bitlines in adjacent columns and two local bitlines selectively coupled to each sense amplifier. Each sense amplifier as $SA_i$ has a master bitline pair MPL, MBL coupled thereto, with MBL extending on one side of the sense amplifier and MBL extending on the other side. Each true master bitline MBL and each complementary master bitline MBL is connected to a different circuit node 82 in between a first bitline select switch 23 and a second bitline select switch 25. Each switch 23 is coupled between a local bitline $LBL_1$ or LBL, closest to an associated sense amplifier and the respective master bitline MBL or MBL. Each switch 25 is coupled between the local bitline furthest from the associated sense amplifier and the associated master bitline. Control lines $87_1$ to $87_4$ alternately connect to respective switches 23 and 25 of alternating columns. To access cells coupled to $LBL_1$ or $LBL_1$, control lines $87_1$ and $87_3$ are driven high whereas control lines $87_2$ and $87_4$ are held low, and vice versa to access cells coupled to $LBL_2$ or $LBL_2$.

In memory array 80, each master bitline is about the same length as each local bitline, and is about half the column length $L_c$ or less. By interleaving the master bitlines in alternating columns, and by their length being about half the column length, the master bitline pitch can be selected to about twice the local bitline pitch in an analogous manner as was described above for the embodiments of FIGS. 4–8 employing folded bitlines. The above-discussed advantages for the embodiments of FIGS. 4–8, e.g., lower MBL capacitance, wider MBL pitch, fabrication with a relaxed manufacturing process, and so forth, are equally applicable to the open bitline configuration of FIG. 9.

The configuration of FIG. 9 can be modified by changing the locations of switches 23 and 25 in a manner analogous to the modification of memory array 30 of FIG. 4 to the memory array 40 of FIG. 7 or 40' of FIG. 8. That is, each local bitline $LBL_1$ and $LBL_1$ can be selectively connected to the associated sense amplifier directly by moving switch 23 in between the local bitline as $LBL_1$ and the sense amplifier input. In this case, each switch 25 is also preferably moved in proximity to the sense amplifier, either in between the master bitline and the respective sense amplifier input as was shown in FIG. 7, or in between the near side local bitline and the master bitline as was shown in FIG. 8. In either case, the far side local bitline $LBL_2$ or $LBL_2$ would be directly connected to the respective master bitline as was shown in FIGS. 7 and 8. Twice as many control lines would be required for either of these modified embodiments.

Figure 10:
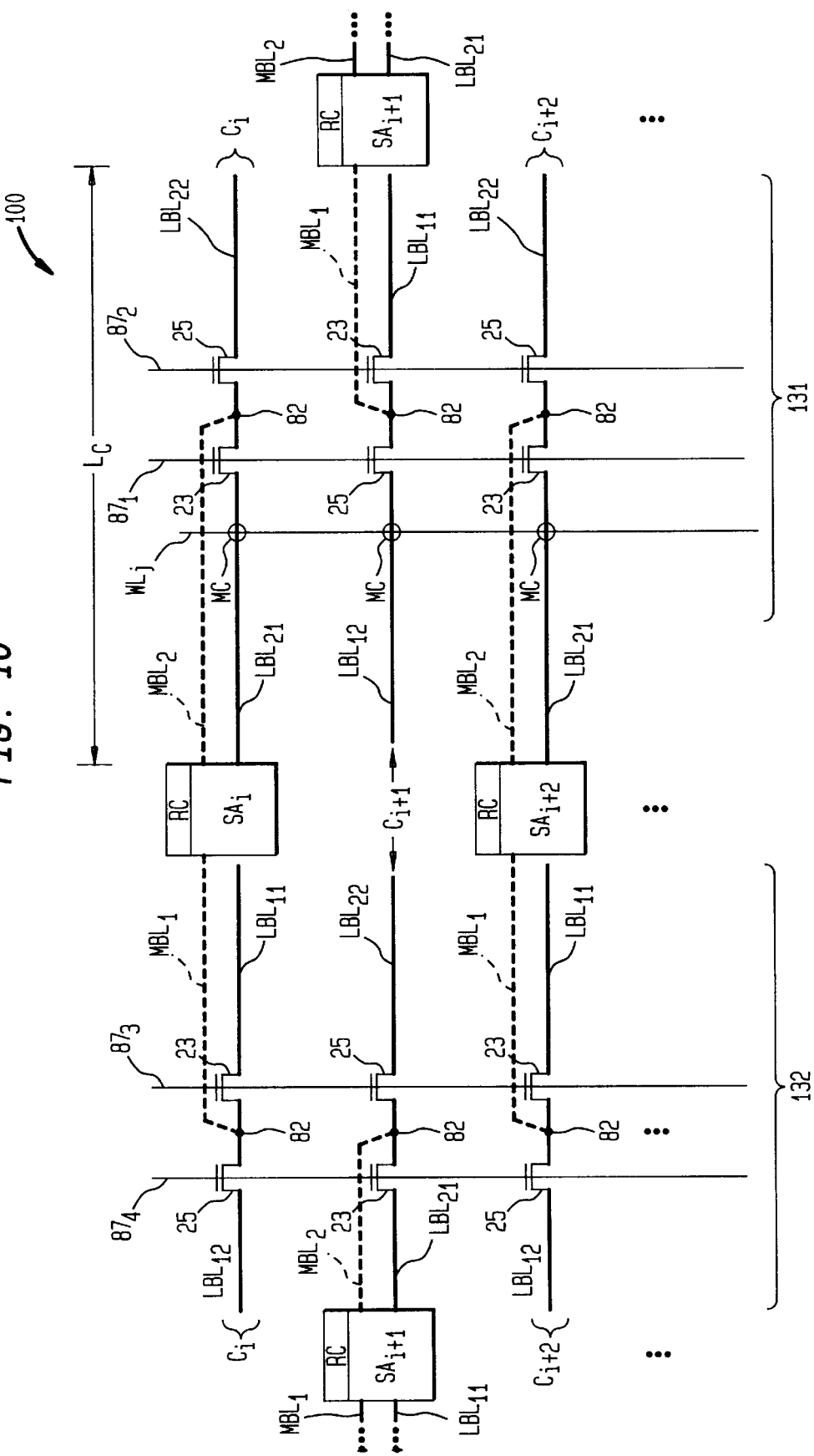
FIGS. 10 and 11 illustrate alternative embodiments of the present invention employing reference cells with each sense amplifier.

FIG. 10 schematically illustrates another embodiment of the present invention, designated as memory array 100. This embodiment avoids complementary master bitlines and complementary local bitlines by employing a reference cell RC within each sense amplifier such as $SA_i$. The reference cell RC provides the reference voltage to the sense amplifier which, in the embodiments described above, is provided by the complementary MBL when cells coupled to the true MBL are accessed, or provided by the true MBL when the complementary MBL is accessed. Memory cell array 100 is suitable for use, e.g., in flash RAM chips.

In memory array 100, each sense amplifier as $SA_i$ is coupled on one side to a first master bitline $MBL_1$ and on the other side to a second master bitline $MBL_2$. To access cells in column $C_i$ coupled to local bitline $LBL_{11}$ of that column, control line $87_3$ is driven high thus turning on switch 23 coupled thereto, while control lines $87_1$, $87_2$ and $87_4$ are held low. Likewise, to access cells in column $C_i$ coupled to $LBL_{12}$, control lines $87_1$–$87_3$ are held low while control line $87_4$ is brought high, and so forth. (It is noted that in the folded bitline embodiments described above, a column of memory cells included memory cells coupled to both the true and complementary local bitlines of a bitline pair, i.e., the memory cells coupled to four local bitlines of each memory block. In the array of FIG. 10, a column is defined as those memory cells coupled to only two local bitlines such as $LBL_{21}$, and $LBL_{22}$ in column $C_i$ of memory block 131 or to $LBL_{11}$ and $LBL_{12}$ in column $C_i$ in memory block 132).

In the layout of memory cell array 100 each MBL is interleaved with the MBL of an adjacent column, each MBL is coupled to only two local bitlines, and each has a length of about one half the column length $L_c$ or less. As such, memory array 100 exhibits the same advantages of the embodiments described above, e.g., wider MBL pitch, reduced MBL capacitance, fabrication with a relaxed manufacturing process, and so on. The MBL pitch is preferably about twice the local bitline pitch.

As was the case for the embodiment of FIG. 9, memory cell array 100 can be modified by changing the locations of switches 23 and 25 in a manner analogous to the modification of memory array 30 of FIG. 4 to the memory array 40 of FIG. 7 or 40' of FIG. 8. That is, each near side local bitline $LBL_{11}$ and $LBL_{21}$ can be selectively connected to the associated sense amplifier directly by moving switch 23 in between the near side local bitline such as $LBL_{11}$ and the sense amplifier input. In this case, each switch 25 is also preferably moved in proximity to the sense amplifier, either in between the master bitline and the respective sense amplifier input, or in between the near side local bitline and the master bitline. In either case, the far side local bitline $LBL_{12}$ or $LBL_{22}$, would be directly connected to the respective master bitline as was shown in FIGS. 7 and 8. Twice as many control lines would be required for either of these modified embodiments.

Figure 11:
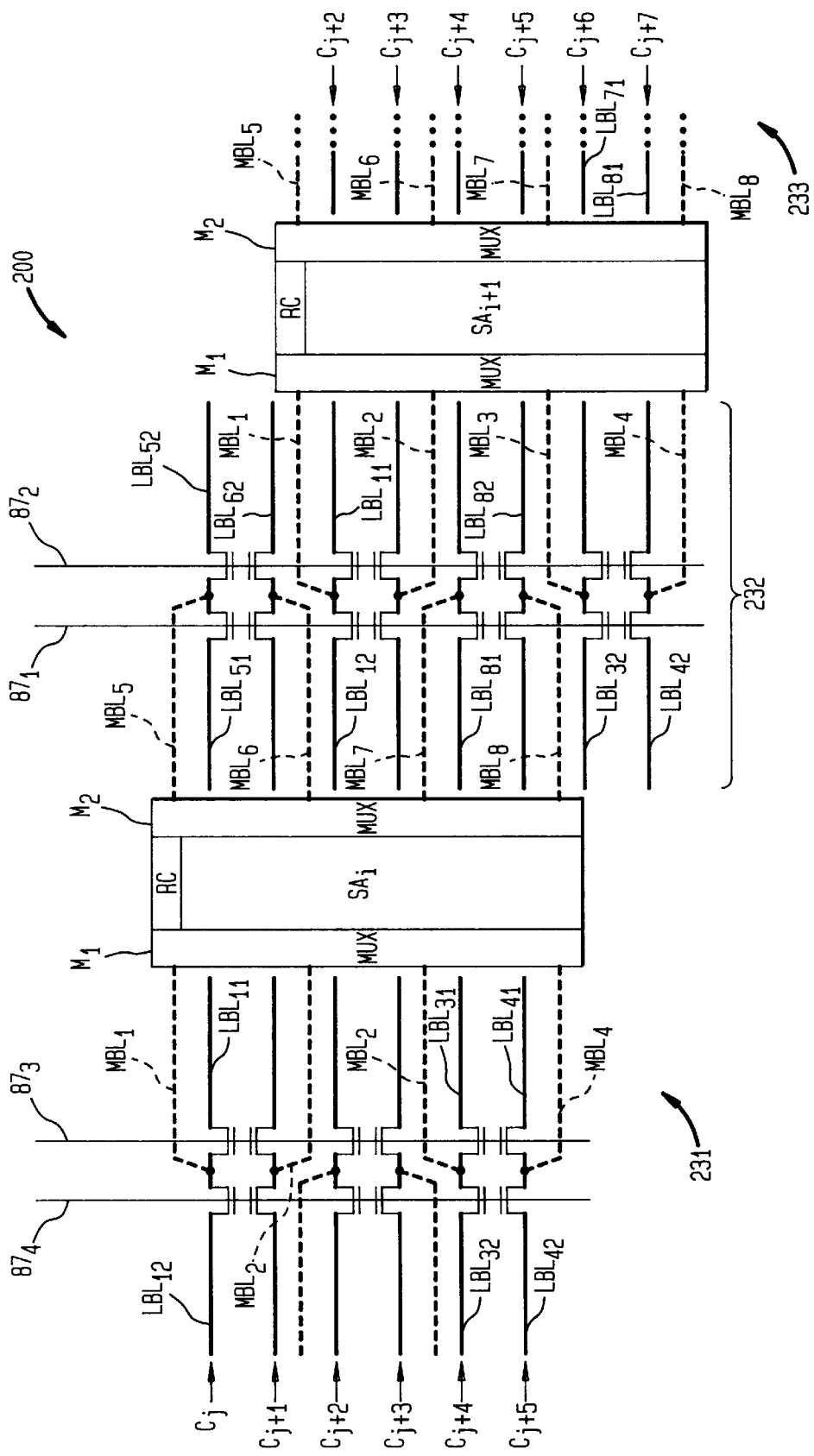

Referring to FIG. 11, memory cell 200 is another embodiment of the present invention. As was the case for memory cell array 100 of FIG. 10, array 200 employs a reference cell RC in conjunction with each sense amplifier as $SA_i$. Each sense amplifier of array 200 is used to amplify cell signal levels of several columns, which is made possible via multiplexers $M_1$ and $M_2$ on either side of each sense amplifier. In the exemplary embodiment of FIG. 11, each sense amplifier is coupled in a shared configuration to master bitlines $MBL_1$–$MBL_4$ on one side via MUX $M_1$ and to $MBL_5$–$MBL_8$ on the other side via MUX $M_2$. $MBL_1$ is selectively coupled to either local bitline $LBL_{11}$ or $LBL_{12}$; $MBL_8$ is selectively coupled to either $LBL_{81}$, or $LBL_{82}$, and so forth. Sense amplifier $SA_i$ selectively amplifies cell signals from memory cells within memory cell blocks 231 and 232 in columns $C_j$, $C_{j+1}$, $C_{j+4}$ and $C_{j+5}$. Sense amplifier $SA_{i+1}$ amplifies cell signals of memory cells in memory blocks 232 and 233 within columns $C_{j+2}$, $C_{j+3}$, $C_{j+6}$ and $C_{j+7}$. As such, in this example, each sense amplifier selectively amplifies signals from four columns on each side. Of course, more or fewer columns can be allocated to each sense amplifier. As in the embodiments described hereinabove, the master bitlines are interleaved and are about one half the column length in each memory block. Also, the MBL pitch is about twice the LBL pitch.

Figure 12:
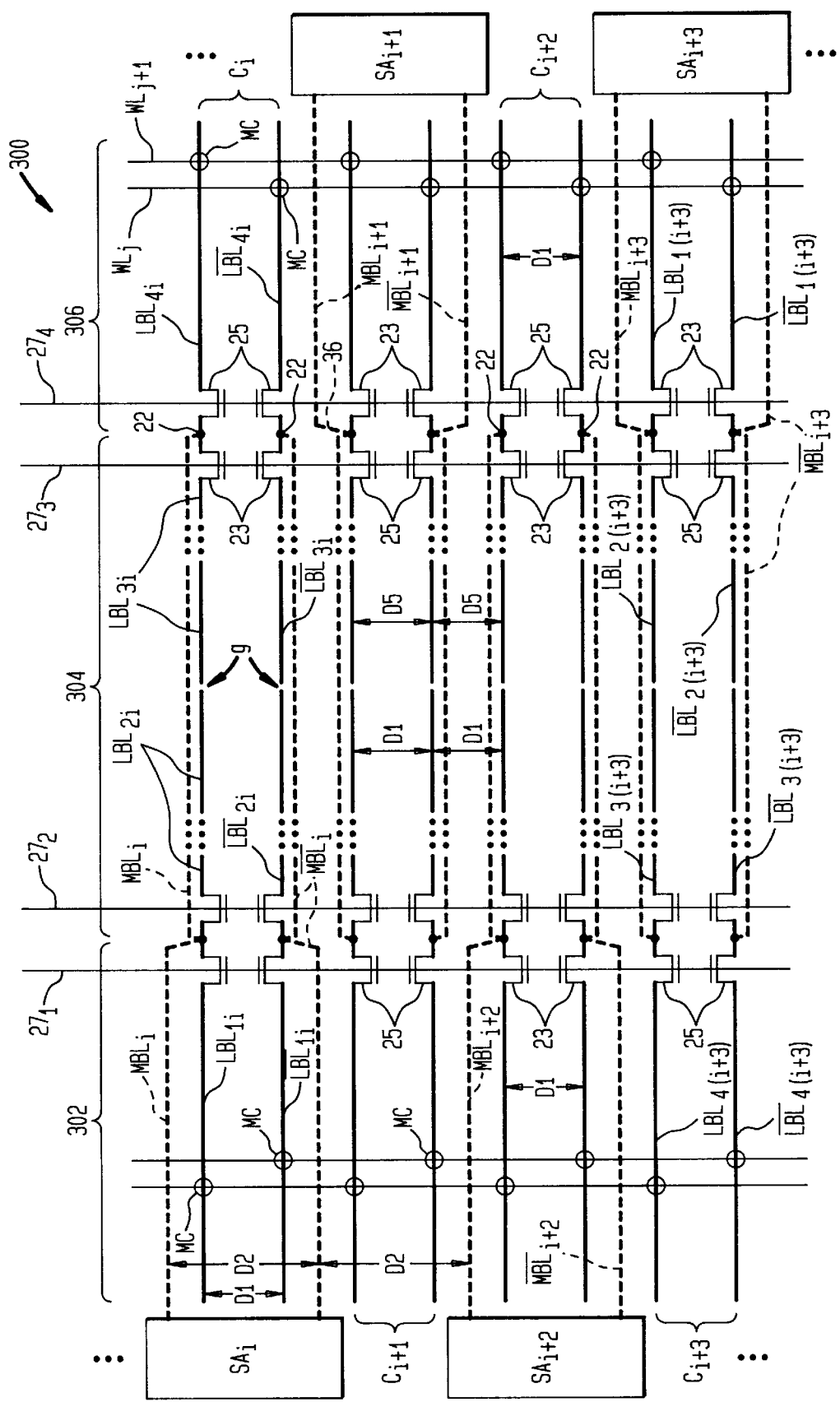
FIG. 12 illustrates a further embodiment of this invention employing more than two local bitlines for each master bitline.

Referring now to FIG. 12, another embodiment of the present invention, memory array 300, illustrates the utility of the present invention when more than two local bitlines are used in conjunction with each master bitline. For this case, master bitline pitch is wider than local bitline pitch in a portion of the memory cell array, rather than for the entire memory cell array as was possible for the embodiments described above.

In the example of FIG. 12, four local bitlines as $LBL_{1i}$–$LBL_{4i}$ are selectively connected to each corresponding master bitline as $MBL_i$ by means of control lines $27_19$–$27_4$ controlling the switching states of bitline switches 23 and 25. The local bitlines in the centralized region 304 are electrically disconnected at the gaps "g". In this example, all local bitlines are assumed to have the same length. In memory block regions 302 and 306, the master bitline pitch D2 is wider than the local bitline pitch D1, preferably about twice the local bitline pitch. In central region 304, the MBL pitch D5 is about the same as the LBL pitch D1. Hence, in this example, the MBL pitch is about twice the LBL pitch for approximately one half of the memory cell array area. Thus, with wider MBL pitch in some portions of the memory cell array area, the probability of shorts or opens occurring is reduced for those portions, thereby improving reliability for the overall memory.

While in the embodiments shown and described above, the master bitlines have been described as being interleaved between spaced sense amplifier banks in alternating columns or alternating pairs of columns, it is understood that in other embodiments, the master bitlines can be designed to run side by side for two or more columns on the left hand side of a memory cell subarray (or memory block) between spaced sense amplifier banks and then run side by side for two or more columns on the right hand side of the subarray. In addition, the master bitlines need not be uniformly spaced from one another, so that, for example, the pitch from column $C_i$ to $C_{i+1}$ can be designed different than the pitch from column $C_{i+1}$ to $C_{i+2}$. For either of these cases, it is still possible to achieve a wider master bitline pitch than local bitline pitch over at least a portion of the overall memory cell array.

From the foregoing, thus disclosed is a new hierarchical bitline architecture for semiconductor memories which affords wide master bitline pitch and low master bitline capacitance without undue complexity. While the above description contains many specifics, these specifics should not be construed as limitations on the scope of the invention, but merely as exemplifications of preferred embodiments thereof. Those skilled in the art will envision many other possible variations that are within the scope and spirit of the invention as defined by the appended claims.

What is claimed is:

1. A semiconductor memory, comprising:

a plurality of memory cells arranged in rows and columns for storing data;

each column having at least one sense amplifier, at least one pair of master bitlines operatively coupled to the sense amplifier, and at least two pairs of local bitlines coupled to memory cells and selectively coupled to the sense amplifier, with at least one of the local bitline pairs selectively coupled to the sense amplifier via the master bitline pair;

wherein each master bitline has a length shorter than a column length and pitch of at least a portion of at least some of the master bitlines over the memory cells is greater than pitch of the local bitlines.

2. The semiconductor memory of claim 1 wherein master bitlines are arranged in an interleaved configuration.

3. The semiconductor memory of claim 1 wherein pitch of the master bitlines is about twice the pitch of the local bitlines.

4. The semiconductor memory of claim 1 wherein width of each master bitline is about one half of the pitch of the master bitlines.

5. The semiconductor memory of claim 1 wherein each master bitline is of about the same length as each local bitline and is about one half of a column length between spaced sense amplifiers, and master bitlines are interleaved in alternating columns.

6. The semiconductor memory of claim 1 wherein at least some of said sense amplifiers are arranged in a shared configuration.

7. The semiconductor memory of claim 6, further comprising four switches on a first side of each shared sense amplifier and four switches on a second side of each shared sense amplifier, each said switch operative to selectively couple an associated local bitline to the shared sense amplifier to permit access to memory cells coupled to that local bitline, and also to selectively isolate a non-selected subarray of memory cells from the shared sense amplifier, said four switches on said first side being off to isolate a first subarray on the first side from the sense amplifier, said four switches on the second side being off to isolate a second subarray on the second side from the sense amplifier.

8. The semiconductor memory of claim 1 wherein each sense amplifier is operatively coupled on one side thereof to a master bitline pair comprising a true master bitline and a complementary master bitline, each sense amplifier is selectively coupled on said one side to first and second local bitline pairs, said first local bitline pair comprising a first true local bitline and a first complementary local bitline, said second local bitline comprising a second true local bitline and a second complementary local bitline, and said memory further comprising:

a first switch coupled between said first true local bitline and said true master bitline;

a second switch coupled between said second true local bitline and said true master bitline;

a third switch coupled between said first complementary local bitline and said complementary master bitline;

a fourth switch coupled between said second complementary local bitline and said complementary master bitline;

wherein said first and second switches are caused to be on and off, respectively, to access memory cells coupled to said first true local bitline, said first and second switches are off and on, respectively, to access memory cells coupled to said second true local bitline, said third and fourth switches are caused to be on and off, respectively, to access memory cells coupled to said first complementary local bitline, and said third and fourth switches are off and on, respectively, to access memory cells coupled to said second complementary local bitline.

9. The semiconductor memory of claim 8, wherein at least some of said sense amplifiers are arranged in a shared configuration, such that each shared sense amplifier is coupled on the other side thereof to one master bitline pair and selectively coupled to two local bitline pairs.

10. The semiconductor memory of claim 8 wherein said first and third switches are controlled by a first common control line and said second and fourth switches are controlled by a second common control line.

11. The semiconductor memory of claim 1 wherein each sense amplifier is operatively coupled on one side to a master bitline pair comprising a true master bitline and a complementary master bitline, each sense amplifier is selectively coupled on said one side to first and second local bitline pairs, said first local bitline pair comprising a first true local bitline and a first complementary local bitline, said second local bitline comprising a second true local bitline and a second complementary local bitline, and said memory further comprising:

a first switch coupled between said first true local bitline and a first sense amplifier input;

a second switch selectively coupling said second true local bitline to said first sense amplifier input;

a third switch coupled between said first complementary local bitline and a second sense amplifier input;

a fourth switch selectively coupling said second complementary local bitline to said second sense amplifier input;

wherein said first and second switches are caused to be on and off, respectively, to access memory cells coupled to said first true local bitline, said first and second switches are caused to be off and on, respectively, to access memory cells coupled to said second true local bitline, said third and fourth switches are caused to be on and off, respectively, to access memory cells coupled to said first complementary local bitline, and said third and fourth switches are caused to be off and on, respectively, to access memory cells coupled to said second complementary local bitline.

12. The semiconductor memory of claim 11 wherein said true master bitline is connected to said second true local bitline and said complementary master bitline is connected to said second complementary local bitline.

13. The semiconductor memory of claim 11, wherein at least some of said sense amplifiers are arranged in a shared configuration, such that each shared sense amplifier is operatively coupled on the other side thereof to one master bitline pair and selectively coupled to two local bitline pairs.

14. The semiconductor memory of claim 11 wherein said first and third switches are controlled by a first common control line and said second and fourth switches are controlled by a second common control line.

15. The semiconductor memory of claim 1 wherein each sense amplifier is operatively coupled on one side to a master bitline pair comprising a true master bitline and a complementary master bitline, each sense amplifier is selectively coupled on said one side to first and second local bitline pairs, said first local bitline pair comprising a first true local bitline and a first complementary local bitline, said second local bitline pair comprising a second true local bitline and a second complementary local bitline, said true master bitline being connected to said second true local bitline, said complementary master bitline being connected to said second complementary local bitline, and said memory further comprising:
a first switch coupled between said first true local bitline and said true master bitline in proximity to a first sense amplifier input;
a second switch selectively coupling said true master bitline to said first sense amplifier input;
a third switch coupled between said first complementary local bitline and said complementary master bitline in proximity to a second sense amplifier input;
a fourth switch selectively coupling said complementary master bitline to said second sense amplifier input;
wherein said first and second switches are caused to be on and off, respectively, to access memory cells coupled to said first true local bitline, said first and second switches are caused to be off and on, respectively, to access memory cells coupled to said second true local bitline, said third and fourth switches are caused to be on and off, respectively, to access memory cells coupled to said first complementary local bitline, and said third and fourth switches are caused to be off and on, respectively, to access memory cells coupled to said second complementary local bitline.

16. The semiconductor memory of claim 14, wherein at least some of said sense amplifiers are arranged in a shared configuration, such that each shared sense amplifier is operatively coupled on the other side thereof to one master bitline pair and selectively coupled to two local bitline pairs.

17. The semiconductor memory of claim 15 wherein said first and third switches are controlled by a first common control line and said second and fourth switches are controlled by a second common control line.

18. The semiconductor memory of claim 1 wherein said semiconductor memory comprises a dynamic random access memory.

19. The semiconductor memory of claim 1 wherein each pair of master bitlines extends on one side of an associated sense amplifier in a folded bitline configuration, and master bitline pairs are interleaved in alternating columns.

20. The semiconductor memory of claim 1 wherein the master bitlines are arranged in an open bitline configuration, with each master bitline pair comprising a true master bitline extending on one side of an associated sense amplifier and a complementary master bitline extending on an opposite side of the associated sense amplifier.

21. A semiconductor memory, comprising:
a plurality of memory cells arranged in rows and columns for storing data;
each column comprising:
(i) at least one sense amplifier;
(ii) a pair of master bitlines arranged in a folded bitline configuration and operatively coupled to at least one side of each sense amplifier in the column;
(iii) two pairs of local bitlines coupled to memory cells on said one side of the sense amplifier, each local bitline pair being selectively coupled to the sense amplifier, with at least one of the two local bitline pairs selectively coupled to the sense amplifier via the master bitline pair;
wherein length of each master bitline pair is about a length of each local bitline pair, master bitline pitch is about twice local bitline pitch, and master bitline pairs are arranged in an interleaved configuration.

22. A semiconductor memory, comprising:
a plurality of memory cells arranged in rows and columns for storing data;
each column comprising:
(i) at least one sense amplifier;
(ii) a pair of master bitlines in an open bitline configuration, operatively coupled to an associated sense amplifier, each pair comprising a true master bitline extending on one side of the associated sense amplifier and a complementary master bitline extending on an opposite side of the associated sense amplifier;
(iii) two local bitlines coupled to memory cells on each side of the sense amplifier, each local bitline being selectively coupled to the associated sense amplifier, with at least one of the two local bitlines being selectively coupled to the associated sense amplifier via a master bitline;
wherein length of each master bitline is shorter than a column length, master bitline pitch is about twice local bitline pitch, and master bitlines are arranged in an interleaved configuration.

23. A semiconductor memory, comprising:
a plurality of memory cells arranged in rows and columns for storing data;
each column having at least one sense amplifier with a reference cell associated therewith for providing a reference voltage, a master bitline operatively coupled to the sense amplifier on a first side thereof, two local bitlines on said first side of the sense amplifier coupled to memory cells and selectively coupled to the sense amplifier, with at least one of the local bitlines selectively coupled to the sense amplifier via the master bitline;
wherein each master bitline has a length shorter than a column length, master bitline pitch is greater than local bitline pitch, and master bitlines are arranged in an interleaved configuration.

24. The semiconductor memory of claim 23 wherein each master bitline is about one half a column length of a memory cell column on one side of the sense amplifier, and the master bitlines are interleaved in alternating columns.

25. The semiconductor memory of claim 23 wherein master bitline pitch is about twice local bitline pitch.

26. The semiconductor memory of claim 23 wherein sense amplifiers are arranged in a shared configuration, with a first master bitline operatively coupled to said first side and a second master bitline operatively coupled to a second side thereof.

27. The semiconductor memory of claim 23, wherein a plurality of master bitlines are operatively coupled to one side of each of a plurality of sense amplifiers via a multiplexer.

28. The semiconductor memory of claim 27 wherein said plurality of sense amplifiers are arranged in a shared configuration, with a first multiplexer on the first side of each sense amplifier and a second multiplexer on a second side of each sense amplifier.

* * * * *